LOW TEMPERATURE VOLTAGE LIMITER

Filed March 30, 1967 2 Sheets-Sheet 1

Inventor :
Robert N. Hall,
by Marvin Snyder
His Attorney.

LOW TEMPERATURE VOLTAGE LIMITER

Filed March 30, 1967

2 Sheets-Sheet 2

Inventor:
Robert N. Hall,
by Marvin Snyder
His Attorney.

United States Patent Office 3,519,894

Patented July 7, 1970

3,519,894

LOW TEMPERATURE VOLTAGE LIMITER

Robert N. Hall, Schenectady, N.Y., assignor to General Electric Company, a corporation of New York Filed Mar. 30, 1967, Ser. No. 627,176
Int. Cl. H01l 9/00
U.S. Cl. 317—234 20 Claims

ABSTRACT OF THE DISCLOSURE

A diode for use as a voltage limiter in superconductive circuitry operated at liquid helium temperatures is comprised of a thin germanium wafer with opposed surfaces heavily doped with impurities of one conductivity type and an intermediate region lightly doped with the same conductivity type impurities. When the wafer is subjected to an electric field of predetermined amplitude, impact ionization of the impurities in the lightly doped region by the free charge carriers occurs, abruptly and drastically lowering the resistivity of the diode.

BACKGROUND OF THE INVENTION

This invention relates to diodes, and more particularly to semiconductor breakdown diodes for operation at superconductive circuit temperatures.

In superconductive circuit technology, need has long existed for a switching device operable at superconductive temperatures and which exhibit a high impedance at voltages below a threshold level but which is also capable of conducting very large currents with either polarity of applied voltage above this threshold level. The need for very large current-carrying capacity imposes the further requirement that this device be of very low impedance when conducting large current. Moreover, because such device is particularly desirable for protecting components of a superconducting circuit from damage if part of the circuit should go normal, it is essential that the device exhibit a fast response to voltage changes which pass through the threshold level.

The present invention describes a device which meets the aforementioned criteria by employment of the phenomenon known as impact ionization which is described, inter alia, in Sclar et al., Impact Ionization of Impurities in Germanium, 2, Journal of the Physics and Chemistry of Solids 1–23 (1957). This device employs a semiconductor wafer, such as germanium, silicon or gallium arsenide, having a region which is lightly doped with impurities of one type conductivity being situated intermediate regions on either side thereof which are doped to degeneracy with impurities of the same conductivity type. At room temperatures, the lightly doped region is a fairly good conductor, although of higher resistivity than the more heavily doped regions. However, at cryogenic temperatures, the resistivity of the lightly doped region is many orders of magnitude higher than at room temperature, due to the phenomenon known as carrier freeze-out. Carrier freeze-out is the process which takes place in semiconductors at cryogenic temperatures wherein a charge carrier, which is mobile at normal room temperatures, becomes trapped at an oppositely charged impurity site and thereby rendered immobile, while also neutralizing the charge on the impurity site. This immobilization of charge carriers results in a region of extremely high resistivity. Thus, at cryogenic temperatures, the resistivity of the lightly doped intermediate region determines the resistance of the device.

Impact ionization occurs in the lightly doped intermediate region of the germanium wafer when the free charge carriers coming from the heavily doped degenerate regions under the influence of an applied electric field of amplitude exceeding a threshold value, acquire sufficient kinetic energy so that they strike the neutral impurities in the high resistivity region of the wafer with sufficient energy to ionize the impurities and thereby liberate the immobilized carriers. The abrupt increase in carriers results in a corresponding decrease to a very low value of resistivity in the intermediate region of the germanium wafer. Impact ionization continues until the electric field is lowered below the threshold value. At this time, impact ionization ceases and carrier freeze-out abruptly re-occurs, resulting in sudden immobilization of charge carriers in the intermediate region of the germanium wafer, and a corresponding abrupt increase in resistivity thereof.

SUMMARY OF THE INVENTION

One object of this invention is to provide a solid state switching device capable of conducting high currents when the voltage thereacross rises above a threshold value.

Another object is to provide a bilateral voltage limiter device for operation at liquid helium temperatures which conducts a high level of current at a very low voltage drop once the voltage thereacross exceeds a predetermined level.

Another object is to control the phenomenon of impact ionization in a semiconductor diode in accordance with a voltage applied across the diode so as to control the impedance level of the diode.

Briefly, in accordance with a preferred embodiment of the invention, a voltage limiter for operation at cryogenic temperatures is provided. The limiter comprises a semiconductor wafer sandwiched between layers of high electrical and thermal conductivity material, the semiconductor being lightly doped with impurities of one conductivity type and having a layer doped to degeneracy with the same conductivity type impurities extending from the surface on opposite sides of the wafer into the wafer to predetermined depth so that the degenerately doped layers are spaced apart from each other by an intermediate layer of the lightly doped semiconductor.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF THE PREFERRED EMBODIMENTS

Figure 1:
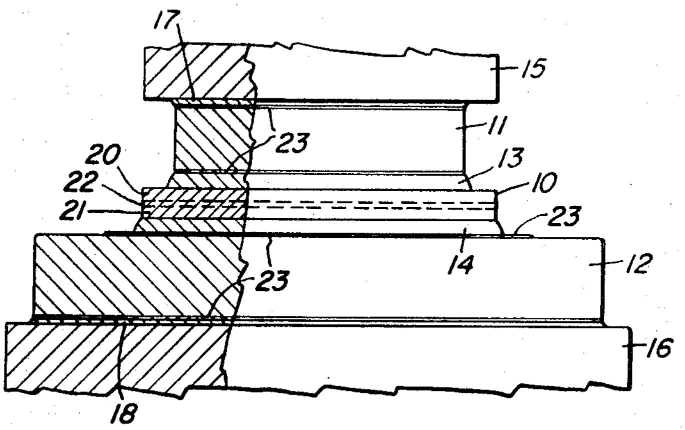
FIG. 1 is a cross sectional view of a voltage limiter constructed in accordance with the teachings of the instant invention.
Figure 2:
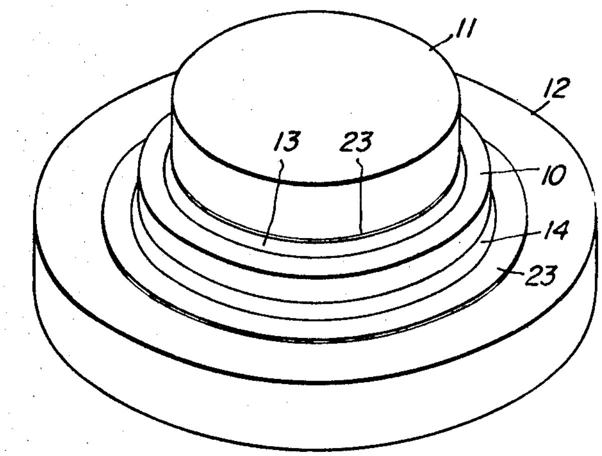
FIG. 2 is an isometric view of the diode of FIG. 1 without its heat sink.

FIG. 1 is a cross sectional view of the voltage limiter of the instant invention. The limiter comprises a wafer 10 of semiconductor such as germanium, silicon or gallium arsenide, here assumed to the germanium, joined to upper and lower molybdenum conductors 11 and 12 respectively through regions of indium 13 and 14 respectively. Alternatively, either or both conductors 11 and 12 may comprise tungsten, while regions 13 and 14 may comprise tin or lead. Molybdenum conductors 11 and 12 are soldered to copper heat sinks 15 and 16 respectively through solder layers 17 and 18 respectively, and thereby provide a thermal expansion match between the germanium and the copper. The solder, which must be as thermally conductive as possible, may suitably be a 50–50 tin-indium solder. Conductors 11 and 12 are preferably plated on both their upper and lower surfaces with a thin layer of gold 23 in order to assist the indium of layers 13 and 14 and the solder of layers 17 and 18 to wet the molybdenum. Indium has been found to be sufficiently conductive, both thermally and electrically, as well as sufficiently compliant at liquid helium temperatures for joining wafer 10 to conductors 11 and 12. The configuration of the diode of FIG. 1 is preferably circular, although the geometrical configurations which may be used for the diode are unrestricted. FIG. 2 is an isometric view of the diode shown in FIG. 1, wherein like numerals indicate like components.

In FIG. 1, germanium wafer 10 is shown to comprise a pair of heavily doped regions 20 and 21 of one conductivity type, while an intermediate region 22 comprises germanium lightly doped with an impurity of the one conductivity type. Although it is feasible to use either P-type impurities such as gallium, indium, aluminum or boron, or N-type impurities such as phosphorous, arsenic or antimony, there is less dependence of the breakdown field on external magnetic fields when P-type impurities are used than when N-type impurities are used. Thus, where the voltage limiter device is intended to be used in the presence of a magnetic field, P-type impurities are preferable to N-type impurities, and it will be assumed herein that wafer 10 is doped with P-type impurities. This requires, if layers 13 and 14 are comprised of lead or tin, that they be doped with an acceptor impurity; for example, 0.5% gallium in order to add acceptor impurities thereto. On the other hand, if wafer 10 is doped with N-type impurities, the indium, lead or tin of layers 13 and 14 is doped with a donor impurity; for example, 0.5% arsenic in order to add donor impurities thereto.

The tungsten or molybdenum of conductors 11 and 12 must be of high purity in order to obtain a sufficiently low thermal resistivity at liquid helium temperatures to achieve desired operation of the voltage limiter. This will be true if the ratio of room temperature electrical resistivity to electrical resistivity at liquid helium temperatures is sufficiently high, preferably above several hundred. Thus, at liquid helium temperatures, voltage drop across conductors 11 and 12 and electrical heating therein due to currents within the desired operating range are relatively negligible. Likewise, the copper of heat sinks 15 and 16 is preferably oxygen-free high conductivity (OFHC) copper of 99.999% purity for similar reasons.

Figure 4:
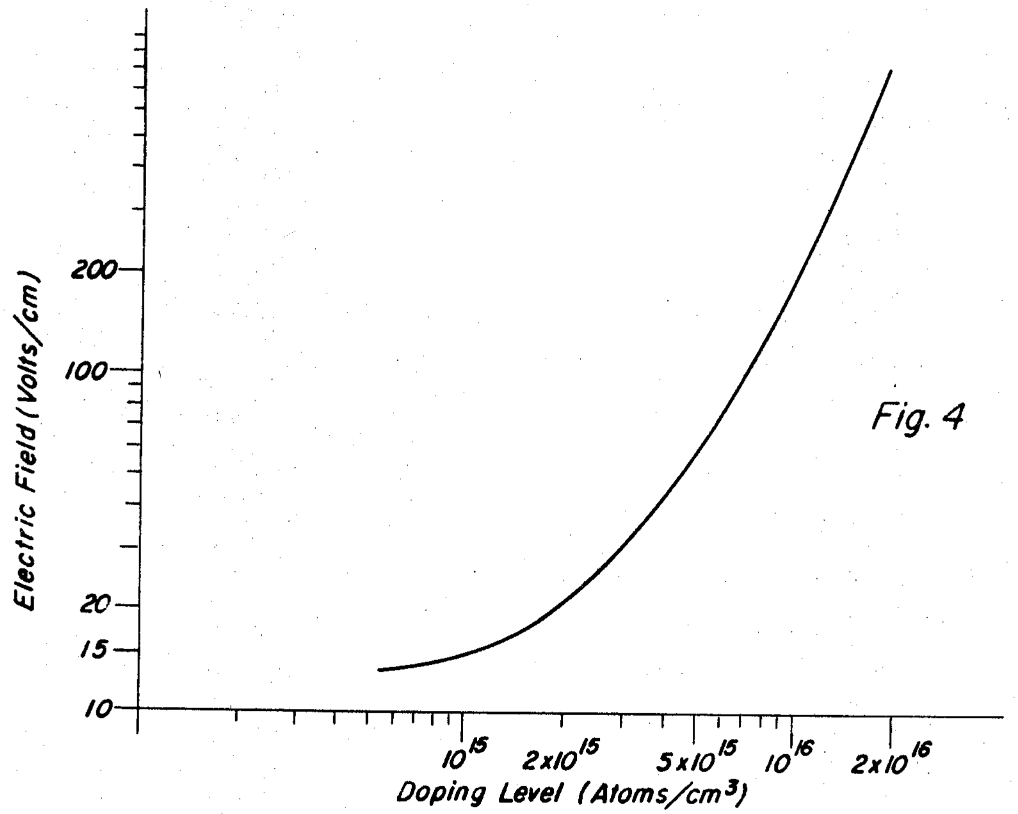
FIG. 4 is a graph illustrating dependence of the electric field required for breakdown in P-type germanium on the concentration of impurities therein at liquid helium temperatures.

Room temperature resistivity of region 22 of wafer 10 is preferably in the range of 0.2 ohm-centimeter to 2 ohm-centimeters, with a typical value being 1 ohm-centimeter, for example. Typical doping levels to achieve these values of room temperature resistivity would be $1.7\times10^{15}$ impurity atoms per cubic centimeter to achieve 2 ohm-centimeter resistivity, or $2\times10^{16}$ impurity atoms per cubic centimeter to achieve 0.2 ohm-centimeter resistivity. Thus wafer 10 is preferably cut from a bar of P-type germanium doped to a level between $1.7\times10^{15}$ and $2\times10^{16}$ atoms per cubic centimeter of P-type impurity. The dependence of the breakdown field for region 22 of wafer 10 on doping level is illustrated in the curve of FIG. 4. It can be seen from this curve that for doping levels below $10^{15}$ atoms per cubic centimeter there is but very slight dependence of the breakdown field on doping level, while above $10^{16}$ atoms per cubic centimeter the breakdown field required becomes impractically large. Regions 20 and 21 are preferably doped to degeneracy at liquid helium temperatures in order to allow low resistance contact to the germanium and thereby ensure a large supply of free carriers. Thus, regions 20 and 21 are diffusion doped with P-type impurities to a concentration of approximately $10^{20}$ atoms per cubic centimeter, which is sufficiently high to achieve degeneracy even at room temperatures. The degenerate doping is accomplished by diffusing gallium, for example, into germanium at a temperature of about 900° C. in a hydrogen atmosphere, for a period of about one week.

At 4.2° K., which is the boiling point of helium, most of the impurities in region 22 of the germanium wafer are frozen out, so that this region exhibits a resistivity in the order of $10^8$ ohm-centimeters. Assuming a typical thickness for region 22 of .005 centimeter, an applied electric field of 50 volts per centimeter results in a voltage of 0.25 volt across lightly doped region 22 which is sufficient to cause impact ionization and liberate the frozen carriers. This lowers the resistivity of region 22, at 4.2° K., to 0.01 ohm-centimeter or less, for the case of germanium doped to a room temperature resistivity of 0.5 ohm-centimeter, for example. A wafer of area 1 square centimeter and total thickness 0.015 centimeter has a breakdown voltage of 0.25 volt, assuming a thickness of 0.005 centimeter for lightly doped region 22. The voltage drop may decrease to 0.15 volt at a current of 500 amps, due to internal heating.

Figure 3:
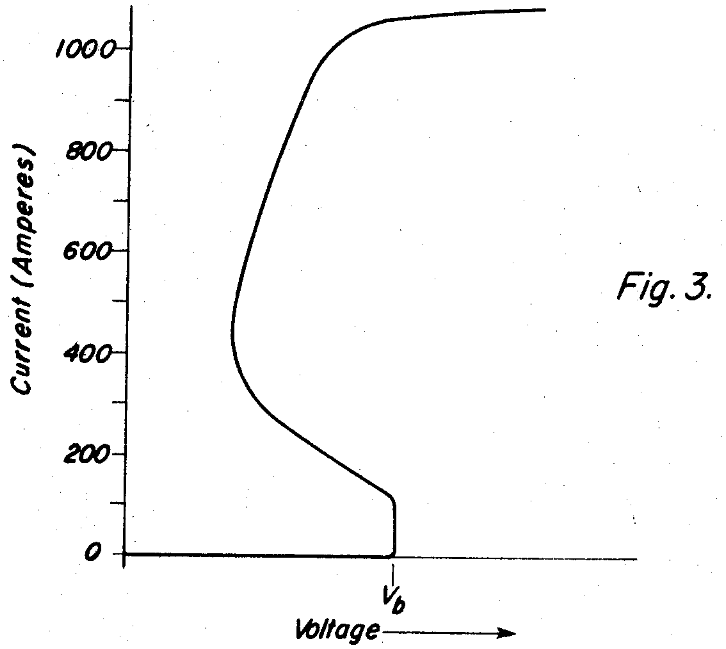
FIG. 3 is a graph of the current-voltage characteristic of the voltage limiter of the instant invention when operated at liquid helium temperatures.

A typical characteristic for the low temperature voltage limiter of the invention is illustrated in FIG. 3 for current and voltage of one polarity; however, because the limiter conducts bilaterally, this characteristic is identical in the opposite polarity direction for current and voltage. As voltage increases from zero across the diode, substantially no current flows through the diode until a threshold voltage $V_b$ is reached, at which time breakdown occurs; that is, the frozen carriers are liberated by impact ionization in the manner previously described. The characteristic for the diode plotted in FIG. 3 indicates that, after breakdown, current may be increased up to 100 amps without any change in voltage across the diode. As current through the diode is increased further, the heat sink can no longer keep the diode at a temperature of 4.2° K., since heat is being generated in the diode faster than it can be conducted away. Hence, temperature of the diode rises slightly, and voltage across the diode decreases. This is due to thermal effects since a rise of 10° K., is sufficient to free the immobilized carriers. As current through the diode is increased still further, the voltage begins to rise as the increasing temperature decreases carrier mobility. The diode may eventually be destroyed by overheating, which occurs after the current-voltage characteristic flattens out; for the particular diode under consideration, this flattening occurs above 1,000 amps. Those skilled in the art will appreciate that improved heat sinks can forestall destruction of the diode by overheating, at least until much larger currents, such as several thousand amperes, are reached.

Figure 5:
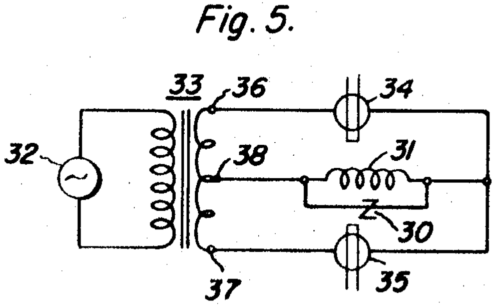
FIG. 5 is a circuit diagram showing application of the voltage limiter to a protective function in a superconducting circuit.

FIG. 5 is a circuit diagram illustrating application of a low temperature voltage limiter 30, constructed in accordance with the teachings of the invention, in performing a protective function for the energizing winding 31 of a superconducting magnet. Winding 31 is energized from an AC power source 32 through a cryogenic transformed 33 by current from the center-tapped secondary winding of transformer 33 through the gates of a pair of cryotrons 34 and 35; that is, one side 36 of the secondary winding of transformer 33 is connected through cryotron 34 to one side of winding 31, while the other side 37 of the secondary winding of transformer 33 is connected through a cryotron 35 to the same side of winding 31. The other side of winding 31 is connected to centertap 38 of the secondary winding of transformer 33. Low temperature voltage limiter 30 is connected in shunt with winding 31.

In operation, the controls of cryotrons 34 and 35 are energized from an external source (not shown) in synchronism with the voltage from AC source 32. Thus, as terminal 36 swings positive with respect to terminal 37, the control of cryontron 34 is de-energized, so that current passes from terminal 36 through superconducting magnet winding 31 to centertap 38. During this time, the control of cryotron 35 is energized, so that cryotron 35 exhibits a high impedance. Thus, the current path is from terminal 36 through the substantially zero impedance gate of cryotron 34 and winding 31 to centertap 38. During the next half cycle of AC source 32, secondary winding output terminal 37 swings positive with respect to terminal 36, and the control of cryotron 35 is deenergized while the control of cryotron 34 is energized. Thus, cryotron 35 presents a low impedance while cryotron 34 exhibits a high impedance, permitting current flow from terminal 37 through the substantially zero impedance gate of cryotron 35 and winding 31 to terminal 38. Under the aforementioned circumstances, energizing winding 31 receives a full-wave rectified DC current which maintains the magnet in an energized condition and, since voltage across voltage limiter 30 thereby remains below the breakdown potential, the limiter presents a high impedance to winding 31 and draws substantially no current.

If both cryotrons 34 and 35 are in their high impedance conditions simultaneously, due to one of the cryotron gates going normal because of an undesired operating condition at a time when the other cryotron gate is normal, the circuit to energizing winding 31 is interrupted. Under these circumstances, the large amount of energy stored in winding 31 would be released into the circuit, destroying the circuit. However, presence of voltage limiter 30 prevents this circumstance from occurring in the following manner.

As long as energizing winding 31 receives current and is in the superconductive condition, the voltage thereacross is substantially zero and, as previously mentioned, voltage limiter 30 remains in the high impedance state. Interruption of current flow to winding 31, however, causes an induced voltage to appear across the terminals of the winding. This voltage rises above the breakdown potential for limiter 30 which thereupon switches immediately into its highly conductive condition due to the phenomenon of impact ionization, as previously described. The result is that the induced current created by the interrupted magnetic field of winding 31 circulates through the circuit comprising winding 31 and limiter 30, and continues to circulate until either cryotron 34 or 35 is again rendered conductive. At such time, the total impedance of the conducting cryotron and the half of the secondary winding of cryogenic transformer 33 connected thereto is less than the impedance of limiter 30, so that the current circulating in the loop comprising winding 31 and limiter 30 is diverted to the path of lower impedance. Thus, current through diode 30 again falls to substantialy zero and normal operation of energizing winding 31 of the superconducting magnet is resumed without any damage to the circuit components or the superconducting magnet itself.

The foregoing describes a solid state switching device capable of conducting high currents when the voltage thereacross rises above a threshold value. The device is capable of functioning as a bilateral voltage limiter for operation at cryogenic temperatures by conducting a high level of current at a very low voltage drop once the voltage thereacross exceeds a predetermined level. The device employs the phenomenon of impact ionization in a germanium wafer for controlling the resistance level of the wafer.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

I claim:

1. A voltage limiter comprising a semiconductor wafer of substantially uniform thickness sandwiched between layers of high electrical and thermal conductivity material, said semiconductor having a layer heavily doped to degeneracy with impurities of one conductivity type extending from the surface on opposite sides of the wafer into the wafer to predetermined depth, said heavily doped layers being spaced apart from each other by an intermediate layer lightly doped with said impurities of one conductivity type, said limiter operating at cryogenic temperatures and exhibiting a high impedance characteristic below a threshold level and a low impedance characteristic above said threshold level.

2. The voltage limiter of claim 1 wherein said semiconductor comprises one of the group consisting of germanium, silicon and gallium arsenide.

3. The voltage limiter of claim 1 wherein said semiconductor comprises germanium.

4. The voltage limiter of claim 1 wherein said semiconductor is coupled to said layers of high electrical and thermal conductivity material through intermediate layers comprising one of the group consisting of indium, lead and tin.

5. The voltage limiter of claim 3 wherein said germanium is coupled to said layers of high electrical and thermal conductivity material through intermediate layers comprising one of the group consisting of indium, lead and tin.

6. The voltage limiter of claim 3 wherein said germanium is coupled to said loyers of high electrical and thermal conductivity material through intermediate layers comprised of indium.

7. The voltage limiter of claim 3 wherein said impurities of one conductivity type comprise at least one of the group consisting of gallium, indium, aluminum and boron.

8. The voltage limiter of claim 3 wherein said impurities of one conductivity type comprise at least one of the group consisting of phosphorus, arsenic and antimony.

9. The voltage limiter of claim 2 wherein said layers of high electrical and thermal conductivity material comprise one of the group of metals consisting of high purity molybdenum and high purity tugnsten.

10. The voltage limiter of claim 4 wherein said layers of high electrical and thermal conductivity material comprise one of the group of metals consisting of high purity molybdenum and high purity tungsten.

11. The voltage limiter of claim 9 including additional material of high thermal conductivity coupled to each of said layers of high electrical and thermal conductivity material.

12. The voltage limiter of claim 10 including additional material high thermal conductivity coupled to each of said layers of high electrical and thermal conductivity material.

13. The voltage limiter of claim 1 including high purity copper heat sink means thermally coupled to said semiconductor.

14. The voltage limiter of claim 3 including high purity copper heat sink means thermally coupled to said germanium.

15. The voltage limiter of claim 5 wherein said layers of high electrical and thermal conductivity comprise one of the group of metals consisting of high purity molybdenum and high purity tugnsten, said voltage limiter further including high purity copper heat sink means thermally coupled to said layers of high electrical and the thermal conductivity.

16. A voltage limiter comprising a semiconductor wafer of substantially uniform thickness sandwiched between layers of high electrical and thermal conductivity material, at least a portion of said semiconductor being lightly doped with impurities of one conductivity type, and low resistivity conductive means contacting said lightly doped semiconductor at either side of the wafer and the layer of high electrical and thermal conductivity material at said side respectively, said limiter operating at cryogenic temperatures and exhibiting a high impedance characteristic below a threshold level and a low impedance characteristic above said threshold level.

17. The voltage limiter of claim 16 wherein said semiconductor comprises one of the group consisting of germanium, silicon and gallium arsenide.

18. The voltage limiter of claim 17 wherein said layers of high electrical and thermal conductivity material comprise one of the group of metals consisting of high purity molybdenum and high purity tungsten.

19. The voltage limiter of claim 18 including additional material of high thermal conductivity coupled to each of said layers of high electrical and thermal conductivity material.

20. The voltage limiter of claim 19 including high purity copper heat sink means thermally coupled to said semiconductor.

References Cited

UNITED STATES PATENTS

| | | | |
|---|---|---|---|
| 3,010,057 | 11/1961 | Albert | 317—234 |
| 3,011,133 | 11/1961 | Koenig et al. | 307—306 X |
| 3,029,353 | 4/1962 | Gold et al. | 307—307 |
| 3,121,808 | 2/1964 | Kang et al. | 307—298 |
| 3,324,358 | 6/1967 | Memelink | 317—235 |
| 3,369,207 | 2/1968 | Hasegawa | 338—23 |
| 3,412,344 | 11/1968 | Pankove | 317—235 X |

JOHN H. HUCKERT, Primary Examiner

M. H. EDLOW, Assistant Examiner

U.S. Cl. X.R.

307—245, 306, 307